(12) United States Patent
Härle

(10) Patent No.: US 7,893,452 B2
(45) Date of Patent: Feb. 22, 2011

(54) OPTOELECTRONIC COMPONENT AND PACKAGE FOR AN OPTOELECTRONIC COMPONENT

(75) Inventor: Volker Härle, Laaber (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 695 days.

(21) Appl. No.: 11/575,797

(22) PCT Filed: Sep. 28, 2005

(86) PCT No.: PCT/DE2005/001735

§ 371 (c)(1),
(2), (4) Date: Dec. 17, 2007

(87) PCT Pub. No.: WO2006/034703

PCT Pub. Date: Apr. 6, 2006

(65) Prior Publication Data

US 2008/0197368 A1    Aug. 21, 2008

(30) Foreign Application Priority Data

Sep. 30, 2004    (DE)    ........................ 10 2004 047 640

(51) Int. Cl.
*H01L 31/00* (2006.01)
(52) U.S. Cl. .......... 257/99; 257/E25.032; 257/E31.058; 257/E33.001; 257/E33.061
(58) Field of Classification Search ........... 257/98–100, 257/432, 433, E25.032, E21.127, 82, 88, 257/233, 292, 918, E33.001, E33.061
See application file for complete search history.

(56) References Cited

U.S. PATENT DOCUMENTS

| 5,907,151 | A | 5/1999 | Gramann et al. |
| 6,066,861 | A | 5/2000 | Höhn et al. |
| 6,669,866 | B1 | 12/2003 | Kummer et al. |
| 6,687,143 | B2 | 2/2004 | Yamamoto et al. |
| 7,078,732 | B1 | 7/2006 | Reeh et al. |
| 2002/0020843 | A1 | 2/2002 | Uemura |

(Continued)

FOREIGN PATENT DOCUMENTS

CN    1319259    5/2007

(Continued)

OTHER PUBLICATIONS

Authorized officer: van der Linden, J.E., International Search Report, PCT/DE2005/001735, Mar. 3, 2006.

*Primary Examiner*—Davienne Monbleau
*Assistant Examiner*—Monica D Harrison
(74) *Attorney, Agent, or Firm*—Fish & Richardson P.C.

(57) ABSTRACT

Optoelectronic components with a semiconductor chip, which is suitable for emitting primary electromagnetic radiation, a basic package body, which has a recess for receiving the semiconductor chip and electrical leads for the external electrical connection of the semiconductor chip and a chip encapsulating eclement, which encloses the semiconductor chip in the recess. The basic package body is at least partly optically transmissive at least for part of the primary radiation and an optical axis of the semiconductor chip runs through the basic package body The basic package body comprises a luminescence conversion material, which is suitable for converting at least part of the primary radiation into secondary radiation with wavelengths that are at least partly changed in comparison with the primary radiation.

15 Claims, 3 Drawing Sheets

U.S. PATENT DOCUMENTS

| | | |
|---|---|---|
| 2002/0195935 A1 | 12/2002 | Jager et al. |
| 2003/0098651 A1 | 5/2003 | Lin et al. |
| 2004/0036081 A1 | 2/2004 | Okazaki |
| 2004/0051106 A1 | 3/2004 | Baur et al. |
| 2004/0183081 A1 | 9/2004 | Shishov et al. |
| 2005/0127377 A1* | 6/2005 | Arndt et al. .......... 257/81 |
| 2005/0151147 A1 | 7/2005 | Izuno et al. |

FOREIGN PATENT DOCUMENTS

| | | |
|---|---|---|
| DE | 10261428 | 7/2004 |
| EP | 0599224 | 6/1994 |
| EP | 0622858 | 11/1994 |
| EP | 0809304 | 11/1997 |
| EP | 1119058 | 7/2001 |
| EP | 1187226 | 3/2002 |
| EP | 1418628 | 5/2004 |
| JP | 2000-164939 | 6/2000 |
| JP | 2000164935 | 6/2000 |
| JP | 2000347601 | 12/2000 |
| JP | 2003243717 | 8/2003 |
| WO | WO 97/50132 | 12/1997 |
| WO | WO 98/12757 | 3/1998 |
| WO | WO 01/08452 | 2/2001 |
| WO | WO 01/50540 | 7/2001 |
| WO | WO 02/052615 | 7/2002 |
| WO | WO 02/056390 | 7/2002 |

\* cited by examiner

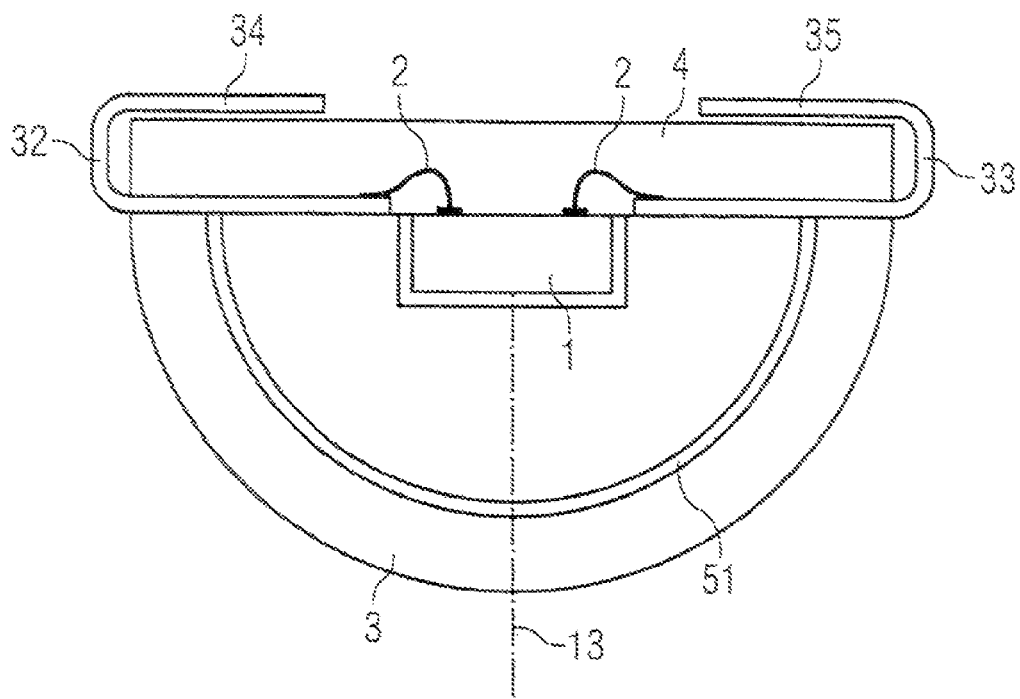
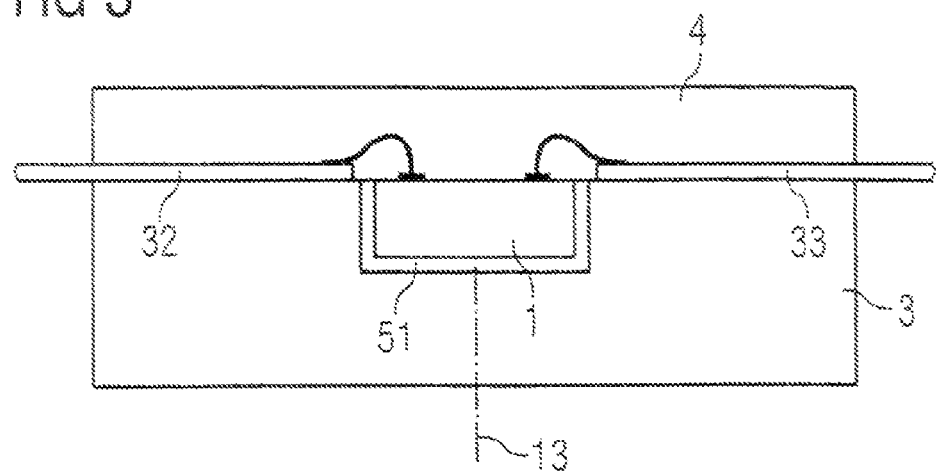

US 7,893,452 B2

OPTOELECTRONIC COMPONENT AND PACKAGE FOR AN OPTOELECTRONIC COMPONENT

CROSS-REFERENCE TO RELATED APPLICATIONS

This application is the National Stage of International Application No, PCT/DE2005/001735, filed on Sep. 28, 2005, which claims the priority to German Patent Application Serial No. 10 2004047640.3, filed on Sep. 30, 2004. The contents of both applications are hereby incorporated by reference in their entireties.

FIELD OF THE INVENTION

The invention relates to an optoelectronic component and to a package for an optoelectronic component.

BACKGROUND OF THE INVENTION

Surface-mountable (SMD) light-emitting diode components (LEDs) in leadframe technology are often mounted in a transfer-moulded or injection-moulded plastic package body prefabricated on the leadframe, are connected there to electrical leads and, for protection against harmful external influences, are encapsulated with a transparent casting compound, through, which light is coupled out during the operation of the LEDs.

In particular in the case of so-called conversion LEDs, in which at least part of the radiation emitted by the semiconductor chip (hereafter primary radiation) is converted by a luminescent material in the casting compound into radiation with an at least partly changed wavelength in comparison with the primary radiation, it is technically often difficult to introduce the intended amount of luminescent material at the intended location. Difficulties are caused in particular by a distribution of the wavelength and a distribution of the brightness of semiconductor chips that are nominally identical. Among the technical problems that are often observed are segregation effects of the luminescent material after application of the casting compound to the chip. The aforementioned aspects make a significant contribution to non-uniformities in the radiation characteristic of conventional conversion. LEDs and adversely affect the yield in mass production.

Known conversion LEDs are described for example in the documents WO 37/50132 A1, WO 98/12757 A1 and WO 01/50540 A1.

SUMMARY OF THE INVENTION

It is, in particular, an object of the present invention to provide an optoelectronic component with which a reproducible radiation characteristic can be achieved in mass production by means which are technically as simple as possible.

Advantageous embodiments and developments of the optoelectronic component and of the package are specified below.

In one embodiment, a semiconductor chip and a luminescence conversion material are provided, the semiconductor chip being suitable for emitting primary electromagnetic radiation and the luminescence conversion material being suitable for absorbing at least part of the primary radiation and emitting secondary radiation with wavelengths that are at least partly changed in comparison with the primary radiation.

Furthermore, a basic package body is provided, having a recess for receiving the semiconductor chip and electrical leads for the external electrical connection of the semiconductor chip, which on the one hand are respectively connected in an electrically conducting manner to electrical contacts of the semiconductor chip and on the other hand respectively have a terminal area which can be contacted from the outside.

The semiconductor chip is mounted in the recess and enclosed by a chip encapsulating element, which is intended to protect the semiconductor chip from harmful environmental influences. The semiconductor chip is, for example, advantageously mounted in the recess by means of a silicone resin compound. The chip encapsulating element may, for example, advantageously comprise a silicone resin compound. Similarly, however, it is conceivable for the chip encapsulating element to comprise a material based on epoxy resin and/or PMMA, in order for example to achieve improved protection against mechanical influences. Furthermore, the chip encapsulating element may comprise a material based on an epoxy resin/silicone resin hybrid material, with for example an epoxy resin fraction of 50 per cent and a silicone resin fraction of 50 per cent.

The basic package body is optically transmissive at least for part of the primary radiation and an optical axis of the semiconductor chip runs through the basic package body, so that a large part of the primary radiation emitted by the semiconductor chip is radiated into the basic package body. The optical axis is in the present case the central axis of a radiation cone emitted by the semiconductor chip. The term "optically transmissive" broadly covers transparency, translucency, transmissivity with dispersing means and other types of optical transmissivity.

The luminescence conversion material is embedded in the basic package body and is suitable for converting at least part of the primary radiation into secondary radiation with wavelengths that are at least partly changed in comparison with the primary radiation. Examples of suitable luminescence conversion materials are specified in the documents WO 97/50132 A1, WO 98/12757 A1 and WO 01/08452 A1, the contents of their disclosure to this extent hereby being expressly incorporated by reference.

During the operation of the component, the basic package body emits electromagnetic radiation which comprises primary radiation passing through the basic package body and secondary radiation emitted by the luminescence conversion material.

In the case of an advantageous embodiment of the basic package body, it comprises a plastic moulding prefabricated by means of an injection-moulding or transfer-moulding process.

In the case of another advantageous embodiment, the basic package body comprises a prefabricated moulding of glass and/or a radiation-transmissive ceramic.

The basic package body advantageously comprises a beam-shaping optical element and/or is itself formed as a beam-shaping optical element.

In the case of an advantageous development of the component, the basic package body has an outer layer, lying away from the recess, and an inner layer, enclosing the recess, between which layers there is a converter layer, which contains the luminescence conversion material.

The thickness and/or the form of the converter layer may in this case be formed advantageously in such a way that it is adapted to correspond to a radiation characteristic of the semiconductor chip that is not uniform over a solid radiating angle.

Particularly suitable is a type of design for components in which the primary radiation comprises ultraviolet radiation and/or shortwave blue radiation.

In the case of a preferred configuration of the component, the basic package body is formed on electrical leads of a metallic electrical leadframe which are connected to electrical contact areas of the semiconductor chip, for example by means of bonding wires.

In the case of a component and a package, the prefabricated basic package body is used for coupling out light and not, as in the conventional way, a clearance made in a prefabricated basic package body filled with a clear casting compound. For this purpose, the prefabricated basic package body is produced from an optically transmissive compound. Luminescence conversion material can then be introduced, inter alia, into this compound in a defined amount and form.

The semiconductor chip, which in such a type of design radiates into the basic package body, is inserted into the recess in the basic package body and fastened there. In the case of semiconductor chips which have an electrical contact on the side facing the basic package body, this advantageously takes place for example, by using a transparent conductive adhesive. In the case of semiconductor chips which have both contacts on the side facing away from the basic package body (for example semiconductor chips based on a nitride III/V compound semiconductor material with a transparent substrate, for example a sapphire substrate), the fastening of the semiconductor chip may take place for example by means of a silicone resin compound.

The advantage of a silicone resin compound is, in particular, its stability with respect to UV and/or shortwave blue radiation. In the recess, the semiconductor chip is enclosed from its rear side by a compound which can be optimised with regard to resistance to harmful environmental influences and the optical properties of which are insignificant.

One particular advantage of the component is that the basic package body including the luminescence conversion material can be adapted in a technically comparatively simple way to the given chip characteristics in each case. There is a possibility of integrating the luminescence conversion material in the basic package body in a defined form, amount and thickness before the semiconductor chip is fitted. After introducing the semiconductor chip, the optical properties of the future component are already fixed, so that the semiconductor chip only has to be electrically connected to the electrical leads.

The placement accuracy of a semiconductor chip using mounting technology that is currently available in mass production is of the order of magnitude of 40-70 μm down to 5 μm, depending on the insertion rate. This placement accuracy combined with prefabricated optics of the prefabricated basic package body advantageously make very exactly defined radiation characteristics of LED components possible.

A further significant advantage is that the package concept opens up the possibility of combining radiation-resistant materials, such a glass for example, with shortwave emitters, that is semiconductor chips emitting ultraviolet and/or shortwave blue radiation.

Further advantages, advantageous embodiments and developments of the invention emerge from the exemplary embodiments described below in conjunction with FIGS. 1 to 4.

BRIEF DESCRIPTION OF THE DRAWINGS

FIG. 2 shows a schematic sectional representation of a second exemplary embodiment, FIG. 3 shows a schematic sectional representation of a third exemplary embodiment.

DETAILED DESCRIPTION OF THE PREFERRED EMBODIMENTS

Figure 1:
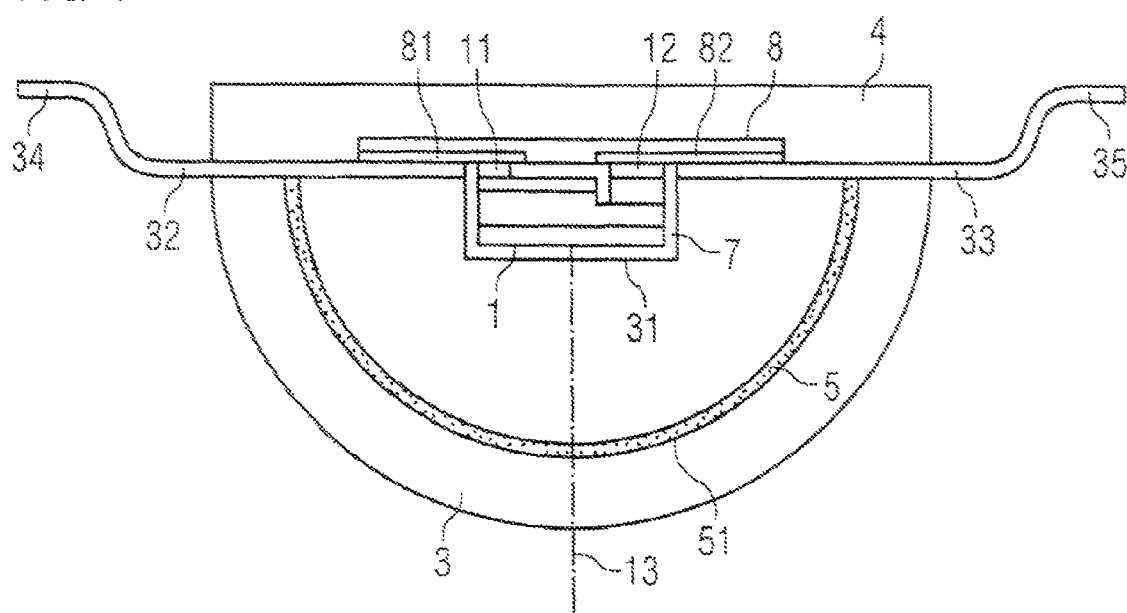
FIG. 1 shows a schematic sectional representation of a first exemplary embodiment.

In the exemplary embodiments and associated figures, component parts that are the same or act in the same way are respectively provided with the same reference numerals. The elements represented in the figures, in particular the layer thicknesses, are not to be regarded as true to scale. Rather, they may in some cases be exaggerated for better understanding.

In the case of the exemplary embodiment according to FIG. 1, a basic package body 3 shaped in a hemispherical manner has a recess 31 on the side of the basic package body 3 facing away from the hemispherically curved surface. Embedded in the basic package body 3 is a luminescence conversion, material 5 in the form of a converter layer 51, which runs parallel to the hemispherically curved surface. That is to say that the converter layer 51 has, for example, the same or substantially the same curvature as the hemispherically curved surface. On account of its hemispherical form, the package body 3 acts as a beam-focusing optical output coupler.

The basic package body 3 comprises, for example, an injection-moulded or transfer-moulded prefabricated moulding of a transparent polymer material, of glass or of a transparent ceramic material.

The basic package body 3 has an outer layer, lying away from the recess 31, and an inner layer, surrounding the recess, between which there is the converter layer 51, which has the luminescence conversion material 5. According to at least one exemplary embodiment, the inner and outer layers are in this case free from luminescence conversion material.

Examples of suitable luminescence conversion materials are specified in the documents WO 97/50132 A1, WO 98/12757 A1 and WO 01/08452 A1 and for this reason are not explained in any more detail at this point.

The recess 31 is made to be of only slightly larger dimensions than the radiation-emitting semiconductor chip 1. For example, the recess 31 is made to be at most 10 per cent larger than the radiation-emitting semiconductor chip 1. With preference, the recess 31 is made to be at most 7 per cent larger than the radiation-emitting semiconductor chip 1. With particular preference, the recess 31 is made to be at most 2.5 per cent larger than the radiation-emitting semiconductor chip 1. For example, the radiation-emitting semiconductor chip 1 is based on a nitride III/V compound semiconductor material and, during its operation, emits, inter alia, ultraviolet and shortwave blue radiation. For example, in the case of the radiation-emitting semiconductor chip 1, the electrical terminal area of the p side and the electrical terminal area of the n side are arranged on its rear side, facing away from the basic package body 3. Such semiconductor chips 1 are known to a person skilled in the art and for this reason are not explained in any more detail at this point. Such semiconductor chips are described for example in the documents EP 593 224 A1 and EP 622 858 A2, the content of their disclosure to this extent hereby being expressly incorporated by reference.

The semiconductor chip 1 is fastened in the recess 31 by means of a bonding layer 7 of transparent silicone resin in such a way that it emits radiation primarily into the basic package body 3. The optical axis 13 of the semiconductor chip 1 runs through the basic package body 3.

On the rear side of the basic package body 3, electrical leads 32, 33 run from outside the basic package body 3 toward the recess 31, to which leads electrical contacts 11, 12 of the semiconductor chip 1 are connected in an electrically conducting manner. This may take place for example, as represented in FIG. 1, by means of a small carrier plate 8 of semiconductor material, which has a p-conductively doped region 81 between a p contact area of the semiconductor chip 1 and the leads 32 assigned to it and a n-conductively doped region 82 between an n contact area of the semiconductor chip 1 and the leads 33 assigned to it. The electrically conducting connections between the contact areas of the semiconductor chip 1 and the assigned doped regions 81, 82 of the small carrier plate 8 may be established for example by means of ITO and/or electrically conducting ZnO layers. Layers of other TCO (transparent conductive oxide) materials are also conceivable.

As an alternative, the electrical connections between the contact areas of the semiconductor chip 1 and the leads 32, 33 may be realised for example by means of bonding wires 2 (cf. FIG. 2) or by means of metal foils or by using other suitable means.

The electrical leads 32, 33 for the electrical connection of the semiconductor chip 1 are self-supporting metallic sheet-metal strips, which on the one hand are respectively connected in an electrically conducting manner to the electrical contacts 11, 12 of the semiconductor chip 1 and on the other hand respectively have a terminal area 34, 35 which can be contacted from the outside. They are formed outside the basic package body in such a way, for example in the manner of a rocker, that the component is surface-mountable.

When using a semiconductor chip 1 on which the electrical terminal areas of the n side and of the p side are on opposite main faces of the semiconductor chip 1, an electrical connecting track, for example a metallic conductor track, is arranged for example in the recess in order to connect the terminal area facing the basic package body 3 to one of the leads 32, 33.

On the rear side of the basic package body 3 there is a plastic moulding compound 4, which encapsulates the semiconductor chip 1 including the small carrier plate 8, the material of which is based for example on epoxy resin or on PMMA and which may be formed so as to absorb radiation and/or reflect it.

The exemplary embodiment according to FIG. 3 differs from those previously described in particular in that the luminescence conversion material 5 is not embedded in the basic package body 3 but is contained in a converter layer 51 between the semiconductor chip 1 and the moulding of the basic package body 3 in the recess 31. This converter layer may comprise, for example, a matrix based on silicone resin, in which the luminescence conversion material 5 is embedded. Similarly, however, a matrix based on glass or a radiation-transmissive ceramic can also be used.

Figure 4:
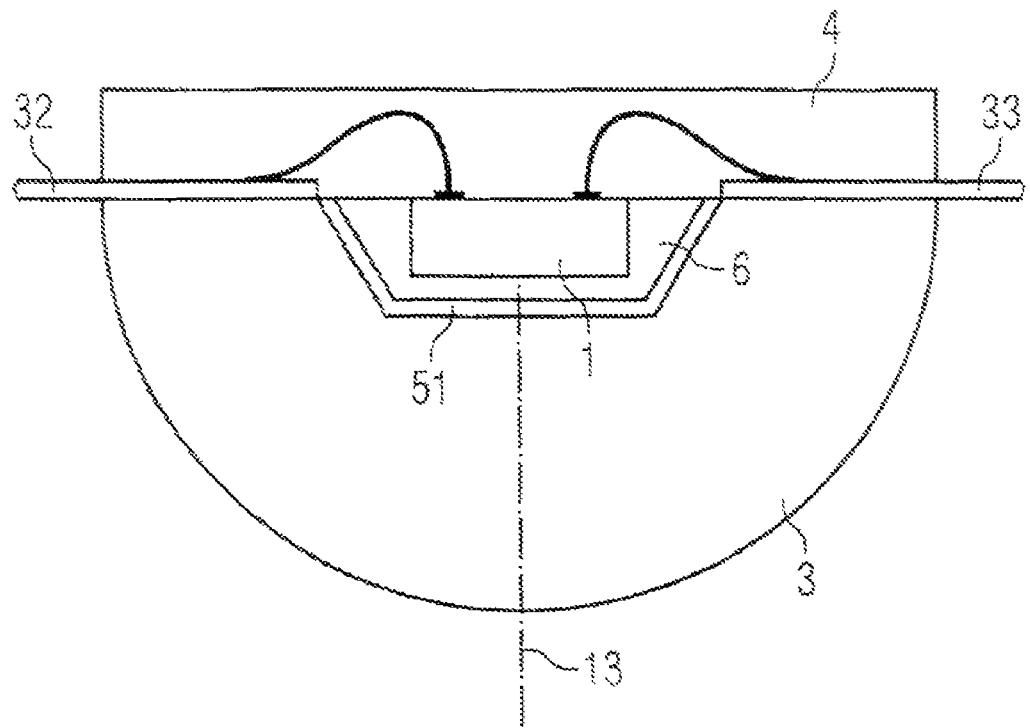
FIG. 4 shows a schematic sectional representation of a fourth exemplary embodiment.

As an alternative, as represented in FIG. 4, the inner surfaces of the recess 31 may be coated with luminescence conversion material 5. A remaining intermediate space between the semiconductor chip 1 and the luminescence conversion material 5 is then preferably filled with a transparent filling compound, such as silicone resin for example.

In the case of all the exemplary embodiments, the thickness and/or the form of the converter layer 51 can be advantageously formed in such a way that it is adapted to correspond to a radiation characteristic of the semiconductor chip 1 that is not uniform over a solid radiating angle.

It goes without saying that the invention is not restricted to the exemplary embodiments that are explicitly described. Rather, the invention, also comprises any novel feature and any novel combination of features, which includes in particular any combination of features revealed to a person skilled in the art in the various claims, even if this combination is not explicitly specified in the patent claims.

The invention claimed is:

1. Optoelectronic component with:
   a semiconductor chip, which is suitable for emitting primary electromagnetic radiation,
   a basic package body, which has a recess for receiving the semiconductor chip and electrical leads for the external electrical connection of the semiconductor chip, which on the one hand are respectively connected in an electrically conducting manner to electrical contacts of the semiconductor chip and on the other hand respectively have a terminal area which can be contacted from the outside, and
   a chip encapsulating element, which encloses the semiconductor chip in the recess, in which component:
   the basic package body is at least partly optically transmissive at least for part of the primary radiation and an optical axis of the semiconductor chip runs through the basic package body, so that a large part of the primary radiation emitted by the semiconductor chip is radiated into the basic package body,
   the basic package body comprises a luminescence conversion material, which is suitable for converting at least part of the primary radiation into secondary radiation with wavelengths that are at least partly changed in comparison with the primary radiation,
   the basic package body has an outer layer, lying away from the recess, and an inner layer, enclosing the recess, between which layers there is a converter layer, which has the luminescence conversion material, and
   during the operation of the component, the basic package body emits radiation which comprises primary radiation passing through the basic package body and secondary radiation emitted by the luminescence conversion material.

2. Optoelectronic component according to claim 1, in which the basic package body comprises a plastic moulding prefabricated by means of an injection-moulding or transfer-moulding process.

3. Optoelectronic component according to claim 1, in which the basic package body comprises a prefabricated moulding of glass or radiation-transmissive ceramic.

4. Optoelectronic component according to claim 1, in which the basic package body comprises a beam-shaping optical element.

5. Optoelectronic component according to claim 1, in which the outer and inner layers are free from luminescence conversion material.

6. Optoelectronic component according to claim 5, in which the thickness and/or the form of the converter layer is formed in such a way that it is adapted to correspond to a radiation characteristic of the semiconductor chip that is not uniform over a solid radiating angle.

7. Optoelectronic component according to claim 1, in which the thickness and/or the form of the converter layer is formed in such a way that it is adapted to correspond to a radiation characteristic of the semiconductor chip that is not uniform over a solid radiating angle.

8. Optoelectronic component according to claim 1, in which the primary radiation comprises ultraviolet radiation and/or shortwave blue radiation.

9. Optoelectronic component according to claim 1, in which the luminescence conversion material is embedded in the basic package body.

10. Package for an optoelectronic semiconductor chip which is suitable for emitting primary electromagnetic radiation, with a basic package body, which has a recess for receiving the semiconductor chip and electrical leads for the electrical connection of the semiconductor chip, which is at least partly transmissive at least for part of the primary radiation and in which there is embedded a luminescence conversion material, which is suitable for converting at least part of the primary radiation into secondary radiation with wavelengths that are at least partly changed in comparison with the primary radiation, which has an outer layer, lying away from the recess, and an inner layer, enclosing the recess, between which layers there is a converter layer, which has the luminescence conversion material.

11. Package according to claim 10, in which the basic package body comprises a plastic moulding prefabricated by means of an injection-moulding or transfer-moulding process.

12. Package according to claim 11, in which the plastic moulding is formed on a metallic electrical leadframe.

13. Package according to claim 10, in which the basic package body comprises a prefabricated moulding of glass or radiation-transmissive ceramic.

14. Package according to claim 10, in which the basic package body comprises a beam-shaping optical element.

15. Package according to claim 10, in which the outer and inner layers are free from luminescence conversion material.

* * * * *

UNITED STATES PATENT AND TRADEMARK OFFICE
CERTIFICATE OF CORRECTION

PATENT NO.        : 7,893,452 B2
APPLICATION NO.   : 11/575797
DATED             : February 22, 2011
INVENTOR(S)       : Volker Härle It is certified that error appears in the above-identified patent and that said Letters Patent is hereby corrected as shown below:

Title Page item 57

Column 2, Line 6 of the Abstract:

Delete "eclement" and insert --element--

Column 2, Line 10 of the Abstract:

After "body" insert --.--

Signed and Sealed this
Tenth Day of May, 2011

David J. Kappos
*Director of the United States Patent and Trademark Office*